(12) United States Patent
Kapusta et al.

(10) Patent No.: US 9,299,661 B2
(45) Date of Patent: Mar. 29, 2016

(54) INTEGRATED CIRCUIT PACKAGE AND METHOD OF MAKING SAME

(75) Inventors: Christopher James Kapusta, Delanson, NY (US); James Sabatini, Scotia, NY (US)

(73) Assignee: General Electric Company, Cchenectady, NY (US)

( * ) Notice: Subject to any disclaimer, the term of this patent is extended or adjusted under 35 U.S.C. 154(b) by 1550 days.

(21) Appl. No.: 12/467,748

(22) Filed: May 18, 2009

(65) Prior Publication Data

US 2010/0244235 A1 Sep. 30, 2010

Related U.S. Application Data

(63) Continuation-in-part of application No. 12/410,255, filed on Mar. 24, 2009.

(51) Int. Cl.
| | |
|---|---|
| *H01L 21/44* | (2006.01) |
| *H01L 23/48* | (2006.01) |
| *H01L 23/538* | (2006.01) |
| *H01L 21/56* | (2006.01) |

(Continued)

(52) U.S. Cl.
CPC .......... *H01L 23/5389* (2013.01); *H01L 21/561* (2013.01); *H01L 23/3114* (2013.01); *H01L 23/3128* (2013.01); *H01L 23/5383* (2013.01); *H01L 24/19* (2013.01); *H01L 24/96* (2013.01); *H01L 25/0655* (2013.01); *H01L 25/105* (2013.01); *H01L 21/568* (2013.01); *H01L 2224/04105* (2013.01); *H01L 2224/20* (2013.01); *H01L 2225/1035* (2013.01); *H01L 2225/1058* (2013.01); *H01L 2924/01005* (2013.01); *H01L 2924/01006* (2013.01); *H01L 2924/01029* (2013.01); *H01L 2924/01033* (2013.01); *H01L 2924/01075* (2013.01); *H01L 2924/01079* (2013.01); *H01L 2924/01082* (2013.01); *H01L 2924/01087* (2013.01); *H01L 2924/14* (2013.01); *H01L 2924/1433* (2013.01); *H01L 2924/18162* (2013.01)

(58) Field of Classification Search
CPC ............ H01L 23/5389; H01L 23/5386; H01L 23/3128; H01L 23/3114; H01L 24/19; H01L 24/96
USPC .......... 257/698, E23.011, 774, 778–784, 786, 257/797, 737, 738, E21.502, E23.068; 438/118, 106, 126
See application file for complete search history.

(56) References Cited

U.S. PATENT DOCUMENTS

| | | |
|---|---|---|
| 3,942,245 A | 3/1976 | Jackson et al. |
| 4,783,695 A | 11/1988 | Eichelberger et al. |

(Continued)

OTHER PUBLICATIONS

Forman et al., "Development of GE's Plastic Thin-Zero Outline Package (TZOP) Technology," IEEE Xplore, 1995, pp. 664-668.

(Continued)

*Primary Examiner* — Hoa B Trinh
(74) *Attorney, Agent, or Firm* — Ziolkowski Patent Solutions Group, SC; Jean K. Testa

(57) ABSTRACT

An integrated circuit package includes a first dielectric layer comprising a dielectric film having a first side and a second side. The package also includes a die having an active surface affixed to a contact location of the first side of the dielectric film. A die stud is affixed to the active surface of the die and extends through the dielectric film to an interconnect location of the second side of the dielectric film.

32 Claims, 9 Drawing Sheets

(51) Int. Cl.
*H01L 23/31* (2006.01)
*H01L 23/00* (2006.01)
*H01L 25/065* (2006.01)
*H01L 25/10* (2006.01)

(56) References Cited

U.S. PATENT DOCUMENTS

| | | | |
|---|---|---|---|
| 5,324,687 | A | 6/1994 | Wojnarowski |
| 5,353,498 | A | 10/1994 | Fillion et al. |
| 5,373,627 | A | 12/1994 | Grebe |
| 5,840,417 | A | 11/1998 | Bolger |
| 6,255,137 | B1 | 7/2001 | Gorczyca et al. |
| 6,284,564 | B1 | 9/2001 | Balch et al. |
| 6,294,741 | B1 | 9/2001 | Cole, Jr. et al. |
| 6,350,664 | B1 | 2/2002 | Haji et al. |
| 6,602,739 | B1 | 8/2003 | Rose et al. |
| 6,800,946 | B2 | 10/2004 | Chason et al. |
| 6,919,508 | B2* | 7/2005 | Forcier .......... 174/565 |
| 6,939,738 | B2 | 9/2005 | Nakatani et al. |
| 7,157,310 | B2 | 1/2007 | Benson et al. |
| 7,553,699 | B2* | 6/2009 | Lee ............... 438/110 |
| 7,855,452 | B2 | 12/2010 | Yanase et al. |
| 2004/0115868 | A1 | 6/2004 | Ono |
| 2005/0056933 | A1 | 3/2005 | Chung |
| 2005/0087859 | A1 | 4/2005 | Chao et al. |
| 2005/0116387 | A1 | 6/2005 | Davison et al. |
| 2005/0153060 | A1 | 7/2005 | McCormack et al. |
| 2005/0212091 | A1 | 9/2005 | Usui et al. |
| 2006/0043606 | A1 | 3/2006 | Imaoka et al. |
| 2006/0049530 | A1 | 3/2006 | Hsu |
| 2006/0158804 | A1 | 7/2006 | Usui et al. |
| 2007/0095471 | A1 | 5/2007 | Ito et al. |
| 2007/0262436 | A1 | 11/2007 | Kweon et al. |
| 2008/0017976 | A1 | 1/2008 | Lai et al. |
| 2008/0032447 | A1 | 2/2008 | Lee |
| 2008/0079164 | A1 | 4/2008 | Kurita et al. |
| 2008/0099912 | A1* | 5/2008 | Wu ............... 257/737 |
| 2008/0182400 | A1* | 7/2008 | Machida et al. ............. 438/614 |
| 2008/0220566 | A1 | 9/2008 | Hsieh et al. |
| 2009/0001599 | A1 | 1/2009 | Foong et al. |
| 2009/0028491 | A1 | 1/2009 | Fillion et al. |
| 2009/0044901 | A1 | 2/2009 | Chen |
| 2009/0127718 | A1 | 5/2009 | Chen |
| 2009/0135574 | A1 | 5/2009 | Tanaka et al. |
| 2009/0245724 | A1 | 10/2009 | Koizumi et al. |

OTHER PUBLICATIONS

Fillion et al., "Reliability Evaluation of Chip-on-Flex CSP Devices," 1998 international Conference on Multichip Modules and High Density Packaging, IEEE Xplore, 1998, pp. 242-246.

New Materials Film Adflema, p. 3, http://www.namics.co.jp/e/event/film.html.

New Materials Film Adflema, 2005, Namics Corporation, http://www.namics.co.jp/e/product/04/02.html.

Package on Package (PoP) Family, Amkor Technology, http://www.amkor.com/go/packaging/all-packages/psvfbga/psvfbga-package-stackable-ver . . . .

High Density Interconnect Technology, General Electric, Inc., Hanover, MD, 1999, http://www.mdatechnology.net/techprofile.aspx?id=439.

Fillion et al., "Embedded Chip Build-Up Using Fine Line Interconnect," 2007 Electronic Components and Technology Conference, IEEE, pp. 49-53.

* cited by examiner

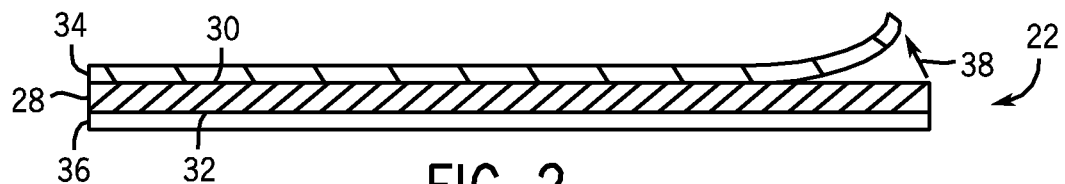
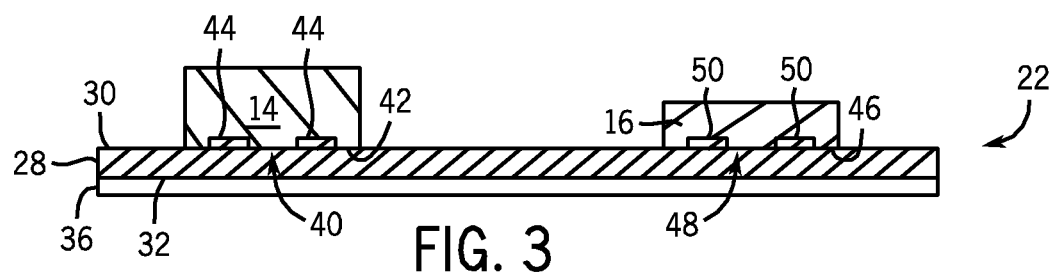
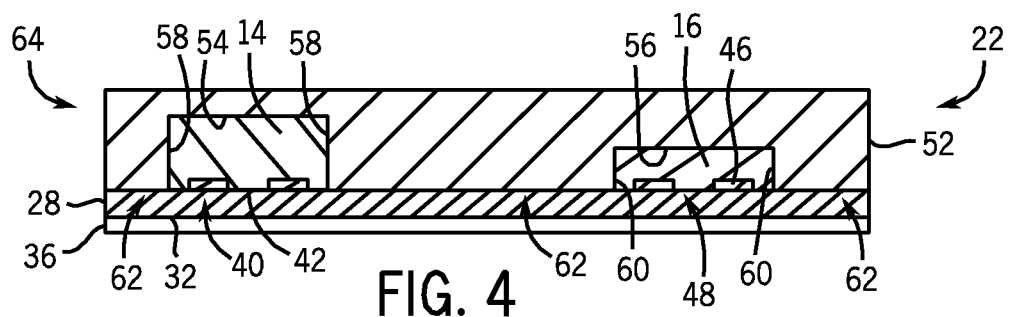
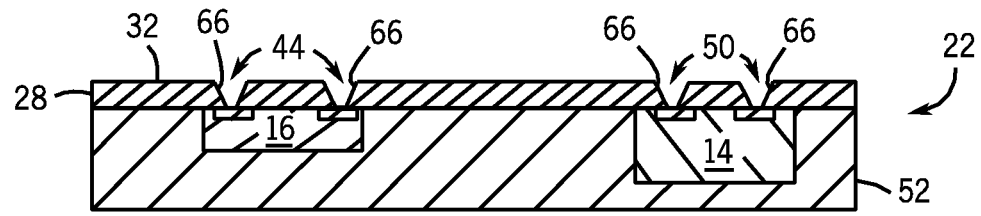

INTEGRATED CIRCUIT PACKAGE AND METHOD OF MAKING SAME

CROSS-REFERENCE TO RELATED APPLICATION

The present application is a continuation-in-part of, and claims priority to, U.S. non-provisional application Ser. No. 12/410,255, filed Mar. 24, 2009, which is incorporated herein by reference.

GOVERNMENT RIGHTS IN THE INVENTION

This invention was made with Government support under grant number FA9453-04-C-003 awarded by the Air Force Research Laboratory. The Government has certain rights in the invention.

BACKGROUND OF THE INVENTION

The invention relates generally to integrated circuit packages and, more particularly, to an apparatus and method of fabricating a package having a reduced thickness.

Chip scale packages or integrated circuit (IC) packages are typically fabricated having a number of dies or chips encapsulated within an embedding compound. A laminate re-distribution layer covers the active side of each of the plurality of dies and typically comprises a dielectric laminate material, such as Kapton, affixed to the plurality of dies using a layer of adhesive. The plurality of dies are electrically connected to an input/output system by way of metal interconnects routed through a plurality of additional laminate re-distribution layers. Each additional re-distribution layer increases the overall thickness of the IC package.

Advancements in IC packaging requirements pose challenges to the existing embedded chip build-up process. That is, it is desired in many current embedded chip packages to have an increased number of re-distribution layers, with eight or more re-distribution layers being common. The advancements are driven by ever-increasing needs for achieving better performance, greater miniaturization, and higher reliability. Thus, as ICs become increasingly smaller and yield better operating performance, packaging technology has correspondingly evolved from leaded packaging, to laminate-based ball grid array (BGA) packaging, to chip-scale packaging (CSP), to flipchip packages, and to embedded chip build-up packaging. However, these stacking methods typically result in an unacceptably thick package height.

Furthermore, due to the small size and complexity of IC packages, the process for fabricating IC packages is typically expensive and time consuming. The fabrication process typically begins by placing the plurality of dies or chips active-side down onto a sacrificial layer, which serves to position and support the plurality of dies during the encapsulation process. Once the encapsulant has cured, the sacrificial layer is removed.

Accordingly, there is a need for a simplified method for fabricating IC packages. There is a further need for a method for fabricating more complex and intricate IC packages while minimizing the thickness of the chip scale package.

It would therefore be desirable to have an apparatus and streamlined method of fabricating a complex IC package having a reduced thickness.

BRIEF DESCRIPTION OF THE INVENTION

The invention provides a system and method of fabricating components of an IC package having a reduced thickness.

In accordance with one aspect of the invention, an apparatus including a first dielectric layer comprising a dielectric film having a first side and a second side is disclosed. The apparatus also includes a die having an active surface affixed to a contact location of the first side of the dielectric film absent a layer of adhesive therebetween that is distinct from a material of the dielectric film. A die stud is affixed to the active surface of the die and extends through the dielectric film to an interconnect location of the second side of the dielectric film, and a via is formed through the dielectric film by the die stud.

In accordance with another aspect of the invention, a method of fabricating an integrated circuit (IC) package includes providing a dielectric film and affixing an electrical component to a first surface of the dielectric film via an adhesive property of the dielectric film by pressing the electrical component into the dielectric film such that an attachment stud of the electrical component through the dielectric film. The method also includes curing the dielectric film after pressing the electrical component thereinto.

In accordance with another aspect of the invention, an apparatus including a dielectric film having a first side and a second side is disclosed. The apparatus also includes a plurality of components affixed to the first side of the dielectric film via an adhesive property of the dielectric film and absent a layer of adhesive between the plurality of components and the dielectric film that is distinct from a property of the dielectric film. The apparatus further includes at least one attachment stud affixed to a contact pad of each of the plurality of components. A via is formed through the dielectric film by the at least one attachment stud.

Various other features and advantages will be made apparent from the following detailed description and the drawings.

BRIEF DESCRIPTION OF THE DRAWINGS

The drawings illustrate embodiments presently contemplated for carrying out the invention.

In the drawings:

FIGS. 2-12 are schematic diagrams showing steps of making an IC package incorporating in accordance with an embodiment of the invention.

DETAILED DESCRIPTION OF THE PREFERRED EMBODIMENT

Figure 1:
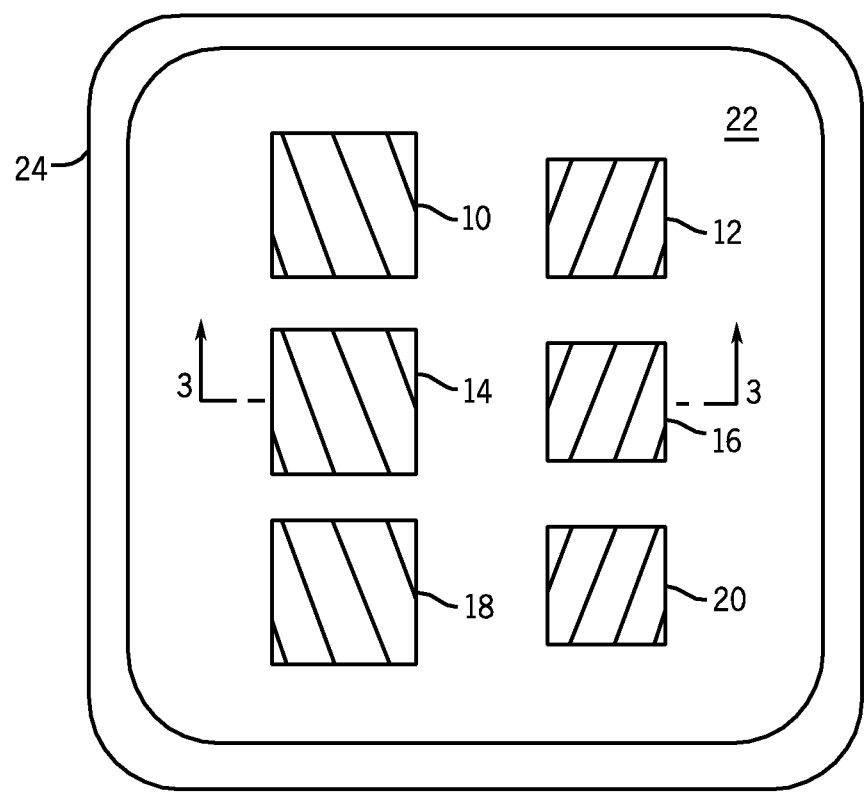
FIG. 1 is a top view of a plurality of dies affixed to a dielectric film layer according to an embodiment of the invention.

FIG. 1 is a top view of a plurality of dies or semiconductor chips 10, 12, 14, 16, 18, 20 positioned on a dielectric tape or film 22. As shown, dielectric film 22 may be stabilized using a frame 24 during the fabrication process such that plurality of dies 10-20 may be positioned thereon. In one embodiment, the height and/or width of each of the plurality of dies 10-20 may differ, which may result from, for example, a tolerance error between different dies. In addition, each of the plurality of dies 10-20 may comprise a different die type, such as, for example, a memory die type, a processing die type, a logic die type, and an application specific integrated circuit (ASIC) die type. Alternatively, each of dies 10-20 may be of the same die type and/or have a substantially similar height and/or width. While FIG. 1 shows a plurality of dies attached to the film 22, in another embodiment of the invention, a plurality of electronic components 10-20 other than a die, such as an active or passive electronic device may be attached to film 22 such that a multi-component module or layer may be formed.

Referring to FIGS. 2-12, a technique for fabricating an IC package 26 is set forth, according to an embodiment of the invention. According to one embodiment, dielectric film 22 may be a thin (e.g., approximately 5 µm) b-staged thermoset film, such as, for example, Adflema™ film acquired from Namics Corporation of Niigata City, Japan. According to another embodiment, dielectric film 22 may be a thermoplastic film. Dielectric film 22 comprises a dielectric layer 28 having homogenous material properties. As shown in FIG. 2, dielectric layer 28 comprises a first side or surface 30, a second side or surface 32, a first sacrificial release liner 34 in contact with first surface 30, and a second release liner 36 in contact with second surface 32. Prior to positioning dies 10-20 (FIG. 1) on dielectric film 22, first sacrificial release liner 34 of dielectric film 22 is removed (as shown by arrow 38) to expose first surface 30. Dies 10-20 may then be positioned face or active side 42 down on first surface 30 of dielectric film 22 as shown below in FIG. 3. As is known, b-staged thermoset materials may become adhesive within a known range of temperatures for the material type. Therefore, the temperature of the dielectric film 22 may be controlled during the fabrication process such that dies 10-20 are held in position solely via an adhesive material property of the dielectric film 22. In one embodiment, dielectric layer 28, and thus first film surface 30, may be adhesive at room temperature. Alternatively, first film surface 30 may become adhesive after heat above room temperature is applied thereto.

As shown in FIG. 3, the fabrication process begins by affixing die 14 to first side or surface 30 of dielectric film 22 at a first contact location 40 such that an active surface 42 of die 14 is directly coupled to first surface 30 of dielectric layer 28. Active surface 42 of die 14 includes any number of contact pads 44 attached thereto. In one embodiment, a well or impression is embossed into dielectric layer 28 at first contact location 40 such that active surface 42 of die 14 is positioned within dielectric layer 28 (i.e., below first surface 30). As described with respect to FIG. 2, because the thermoset material of dielectric layer 28 is an adhesive within a known range of temperatures, the temperature of dielectric layer 28 may be controlled during the fabrication process such that die 14 bonds directly to first surface 30 of dielectric layer 28 and no additional layer of adhesive is needed between die 14 and first surface 30. Alternatively, a heated tip or collet of a pick-and-place machine may be used to heat die 14 prior to placing die 14 on dielectric layer 28. Thus, when heated die 14 is placed at first contact location 40 of dielectric layer 28, heat from die 14 causes first contact location 40 to become adhesive, and die 14 bonds to dielectric layer 28. In a similar manner, an active side or surface 46 of die 16 may be coupled directly to first surface 30 of dielectric film 22 at a second contact location 48 via adhesive properties of dielectric layer 28. Active surface 46 of die 16 includes any number of contact pads 50 attached thereto. Any voids or air gaps between dies 14, 16 and dielectric layer 28 may be removed using vacuum lamination. Together, dies 10-20 and dielectric layer 28 form a reconstituted wafer 64.

Figure 5:
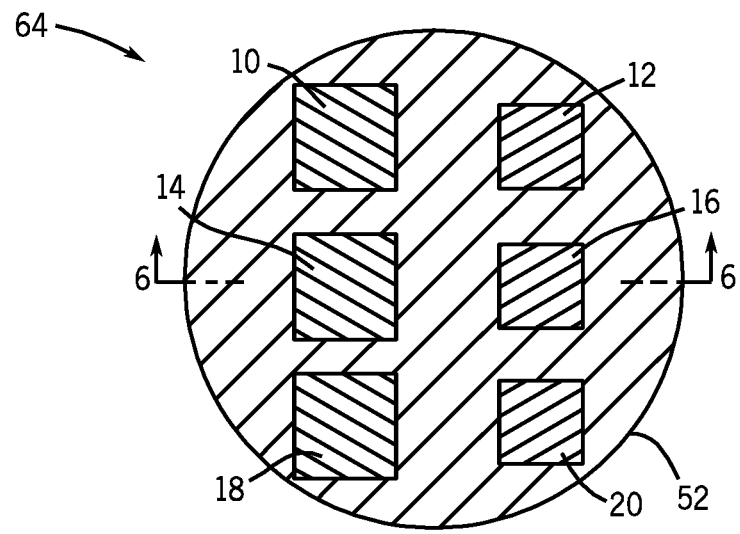
Figure 6:
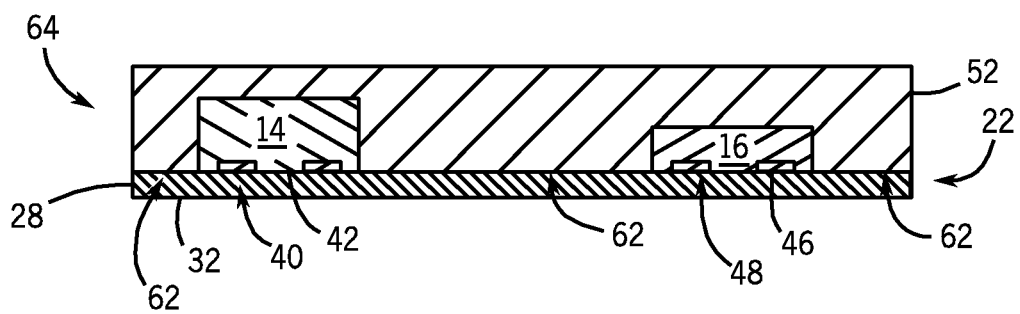

As shown in FIG. 4, after dies 14, 16 are positioned and affixed to dielectric layer 28, an encapsulant or embedding compound 52 is applied to encapsulate bulk surfaces 54, 56 and sides 58, 60 of dies 14, 16, respectively, and coat non-contact locations or portions 62 of dielectric film 22. In one embodiment, encapsulant 52 is an epoxy. Encapsulant 52 and dielectric layer 28 are then allowed to cure. While encapsulant 52 is included in FIGS. 4-12, other embodiments of the invention include no encapsulant 52 and instead use a thicker dielectric film 22 having, for instance, a thickness of up to 150 µm. Referring now to FIGS. 5 and 6 in combination, once encapsulant 52 and dielectric layer 28 have cured, frame 24 (FIG. 1) may be removed and second release liner 36 is removed from dielectric film 22.

Figure 8:
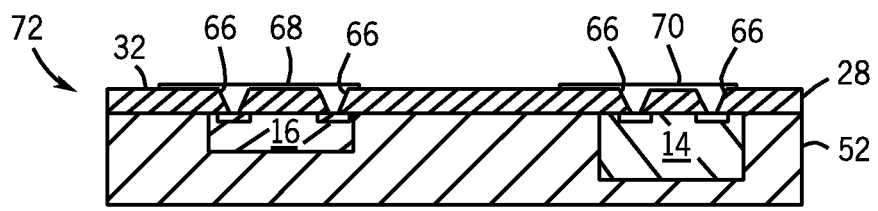

Referring now to FIG. 7, a plurality of vias 66 are formed through dielectric layer 28 to expose contact pads 44 of die 14 and contact pads 50 of die 16. As used herein, a via is a dielectric layer through-hole through which a metallization path or other conducting means may pass in order to electrically couple one side of the dielectric layer to the other. Vias 66 may be formed by, but not limited to, laser drilling or dry etching, for example. As shown in FIG. 8, metallization paths or electrical interconnect layer 68, 70 are formed on second surface 32 of dielectric layer 28 in a next step of the fabrication process. Metallization paths 68, 70 extend through vias 66 and are electrically coupled to contact pads 44, 50 of dies 14, 16, respectively. Metallization paths 68, 70 may comprise, for example, a layer of copper. In one embodiment, metallization paths 68, 70 may be formed using a sputtering and plating technique, followed by a lithography process. Together, metallization paths 68, 70, vias 66, and dielectric layer 28 form a first re-distribution layer 72.

Figure 9:
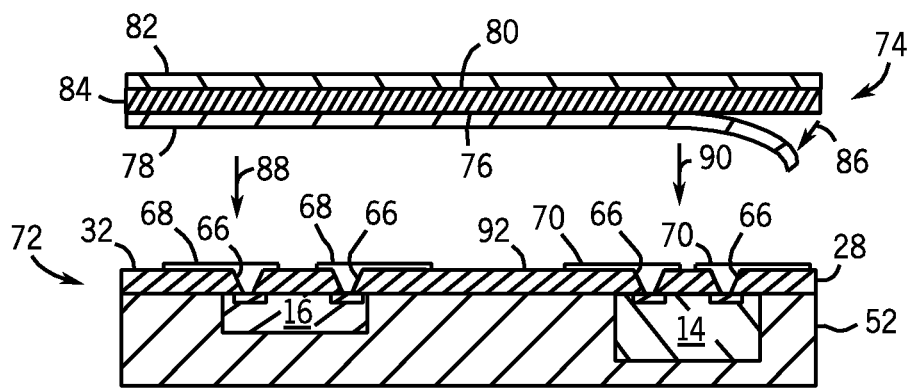
Figure 10:
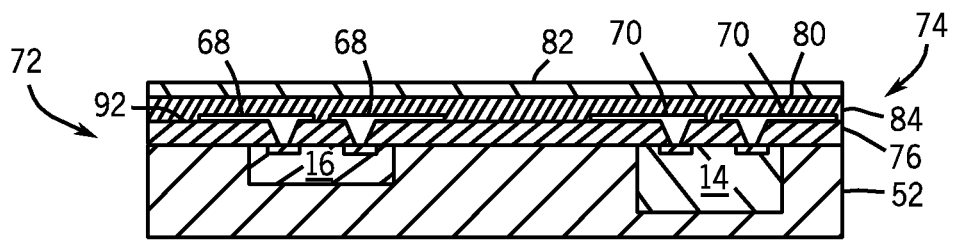
Figure 11:
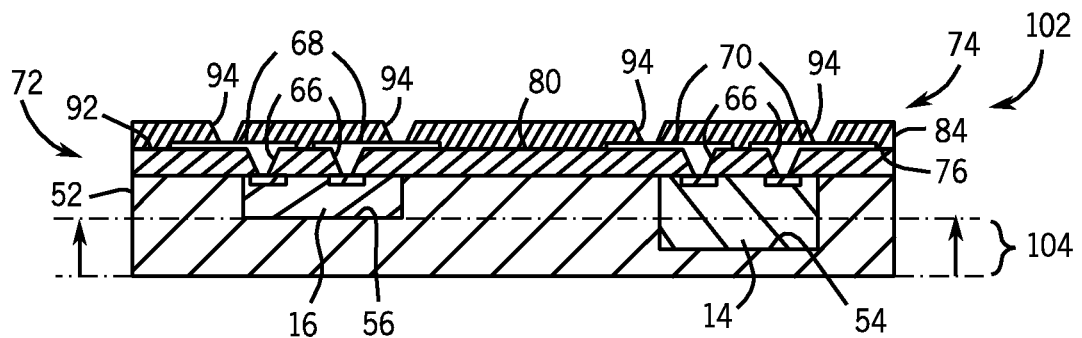

Referring now to FIG. 9, according to one embodiment of the invention, in a next manufacturing step, a second dielectric film 74 is coupled to the first re-distribution layer 72. Similar to dielectric film 22 (FIG. 2), second dielectric film 74 comprises a first film surface 76 covered by a first release liner 78, a second film surface 80 covered by a second release liner 82, and a dielectric layer 84 sandwiched therebetween. According to an exemplary embodiment, dielectric layer 84 may comprise a b-staged thermoset material that acts as an adhesive within a known range of temperatures. To affix first re-distribution layer 72 to dielectric layer 84, first release liner 78 is removed (as shown by arrow 86) and first film surface 76 of second dielectric film 74 is directly coupled (as shown by arrows 88, 90) to a top surface 92 of first re-distribution layer 72. As described above with respect to dielectric layer 28, the adhesive property of dielectric layer 84 causes dielectric layer 84 to bond to first re-distribution layer 72. Therefore, as shown in FIG. 10, an adhesive layer distinct from dielectric layer 84 is not included.

Figure 12:
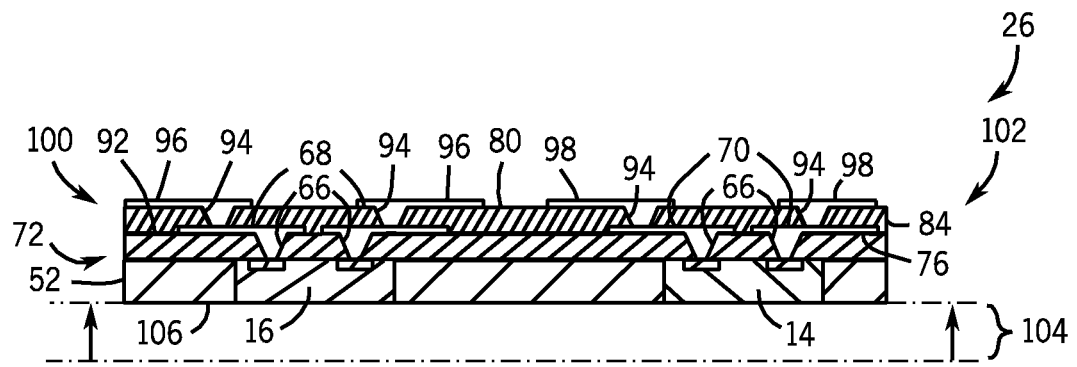

As shown in FIG. 1, in a next step of manufacturing, second release liner 82 of second dielectric film 74 has been removed, and a second plurality of vias 94 are formed through dielectric layer 84 in a similar manner as described with respect to FIG. 5. Metallization paths 96, 98, shown in FIG. 12, are next formed through dielectric layer 84, pass through vias 66 and are electrically coupled to metallization paths 68, 70. Together, metallization paths 96, 98, vias 94, and dielectric layer 84 form a second re-distribution layer 100. Because the thermoset material of dielectric layer 84 itself adheres metallization paths 68, 70 of first re-distribution layer 72 to dielectric 74 of second re-distribution layer 100, a conventional adhesive layer is not needed between adjacent re-distribution layers 72, 100. Together, first re-distribution layer 72 and second re-distribution layer 100 form a re-distribution stack 102. Because a conventional adhesive layer is not included in stack 102, an overall thickness or height of re-distribution layers 72, 100, and therefore, IC package 26, is decreased.

It is contemplated that the process for forming second re-distribution layer 100 described in FIGS. 9-12 may be repeated any number of times to form a re-distribution stack having any desired number of re-distribution layers. Alternatively, any second and/or subsequent re-distribution layer may be constructed using a known method of fabricating a re-distribution layer, such as, for example, spin-coating or spray-coating a dielectric layer onto first re-distribution layer 72 or bonding a dielectric laminate layer, such as Kapton, to first re-distribution layer 72 using a conventional layer of adhesive. The resulting re-distribution layers can be configured in any fashion to aid in second level assembly, for example by solder attachment, or wire bonding to a printed circuit board (PCB) board.

Referring now to FIG. 12, after re-distribution stack 102 is fabricated, an overall thickness or height of IC package 26 may be reduced by removing a thickness 104 of bulk material from encapsulant 52 and dies 14, 16. As shown, the grinding process removes any inconsistencies in the height of dies 14, 16, and IC package 26 may be formed having a planer bottom surface 106. IC package 26 may then be cut into individual chip scale packages (CSP) or multi-chip modules (MCM), which may, for example, be mounted onto conventional printed circuit boards or stacked to form package-on-package (POP) structures.

Accordingly, embodiments of the invention include an IC package having a plurality of individual components or dies, which may be of differing sizes and/or component types. The plurality of individual components or dies are positioned on a dielectric film layer and encapsulated, forming a reconstituted wafer. A stack of individual re-distribution layers are then applied to the reconstituted wafer to connect contact pads on the dies to an input/output system. Because each re-distribution layer includes a dielectric film layer, additional adhesive layers are not needed in the re-distribution stack, thus reducing the overall height of the IC package.

Figure 13:
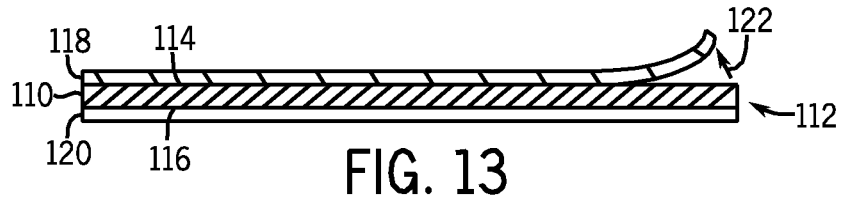
FIGS. 13-17 are schematic block diagrams showing steps of making a chip scale package in accordance with another embodiment of the invention.

Referring now to FIGS. 13-17, a technique for fabricating an IC package is set forth, according to another embodiment of the invention. As shown in FIG. 13, a dielectric layer 110 comprises a metal-clad dielectric film 112 having a first side or surface 114 and a second side or surface 116, a release liner 118 in contact with first surface 114, and a metal cladding 120 in contact with second surface 116. Dielectric film 112 may be held taut in a frame, such as frame 24 of FIG. 1, during the fabrication process. According to one embodiment, dielectric film 112 may be a thin (e.g., approximately 15 μm) b-staged thermoset film such as, for example, a copper-clad Adflema™ film acquired from Namics Corporation of Niigata City, Japan. Alternatively, dielectric film 112 may be a thermoplastic material.

Figure 14:
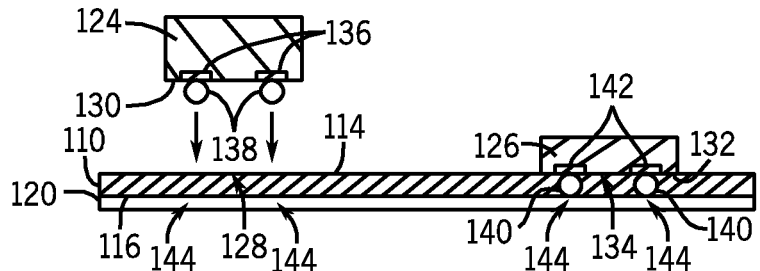

As shown in FIGS. 13 and 14, the fabrication technique begins by removing release liner 118 from dielectric film 112 (as shown by arrow 122) to expose first surface 114. Dies 124, 126 are then positioned on dielectric film 112. As shown in FIG. 14, die 124 is affixed to first surface 114 at a first contact location 128 such that an active surface 130 of die 124 is directly coupled to first surface 114 of dielectric film 112. Likewise, active surface 132 of die 126 is directly coupled to first surface 114 of dielectric film 112 at a second contact location 134. In an alternative embodiment, dielectric layer 110 may be pre-patterned with embossed wells to receive dies. As described above with respect to FIGS. 2-12, the temperature of dielectric film 112 may be controlled during the fabrication process such that dies 124, 126 are held in position solely via an adhesive material property of the dielectric film 112. Any voids or air gaps between dies 124, 126 and dielectric layer 110 may be removed using vacuum lamination.

Active surface 130 of die 124 includes any number of die pads or contact pads 136 each having a corresponding die stud or attachment stud 138 attached thereto. As shown, attachment stud 138 extends away from active surface 130 of die 124. Likewise, any number of die studs 140 may be affixed to die pads 142 corresponding to active surface 132 of die 126. In one embodiment, die studs 138, 140 may be, for example, gold stud bumps formed by wire bonding are affixed to contact pads 136. In an alternative embodiment, die studs 138 may be proud plated pads formed by sputter-plating metal layers onto contact pads 136 that extend away from active surface 130. If a sputter-platting process is used to form die studs 138, smaller and/or thinner (e.g., approximately 5-20 μm) die studs having differing sizes may be formed on active surfaces 130.

Figure 15:
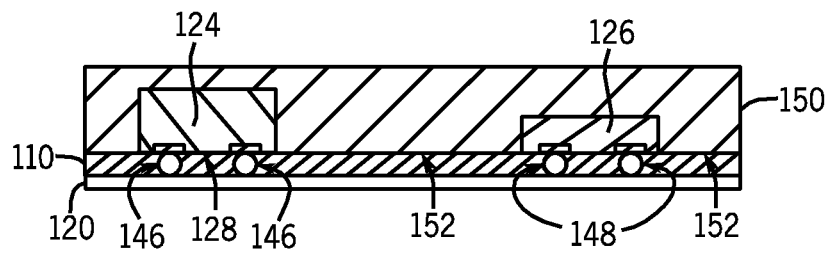

As shown in FIG. 14 and FIG. 15, when dies 124, 126 are positioned on first surface 114, die studs 138, 140 are pressed through dielectric layer 110 to a corresponding interconnect location 144 on second side 116 of dielectric film 112 and into contact with copper cladding 120. A via 146, 148 is formed through dielectric film 112 by each of die studs 138, 140, respectively. While die studs 138, 140 are shown in FIGS. 14-15 as being flush with second surface 116 of film 112, die studs 138, 140 may extend beyond second surface 116 if the length of die studs 138, 140 is larger than the thickness of dielectric layer 110. In one embodiment, a coining process may be used to remove an excess portion of die studs 138, 140 such that die studs 138, 140 are flush with second surface 116.

Referring now to FIG. 15, a layer of encapsulant or embedding compound 150 is applied to encapsulate dies 124, 126 and coat portions 152 of dielectric film 110 outside contact locations 128, 134, similar to the process described with respect to FIG. 4. Encapsulant 150 and dielectric layer 110 are then allowed to cure. As described with respect to FIG. 4, while encapsulant 150 is included in FIGS. 15-17, other embodiments of the invention include no encapsulant 150 and instead use a thicker dielectric film 110 having, for instance, a thickness of up to 150 μm.

Figure 16:
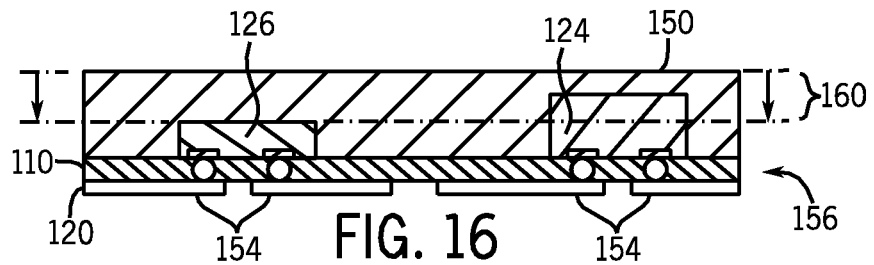
Figure 17:
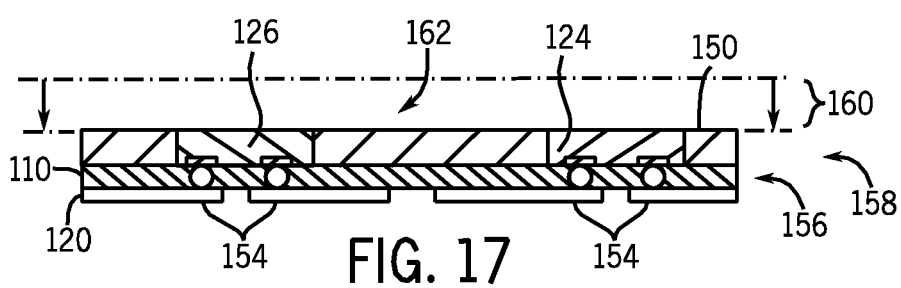

As shown in FIG. 16, once encapsulant 150 and dielectric layer 110 have cured, copper cladding 120 may be patterned to form a series of interconnection paths 154 extending into interconnect locations 144 (FIG. 14). Interconnection paths 154 may be used to connect contact pads die pads 132, 136 to an input/output system. In one embodiment, interconnection paths are formed using an etching process. Die studs 138, 140 electrically connect die pads 132, 136 to interconnection paths 154 and eliminate the need for vias such as those described in FIG. 7, to be machined in dielectric layer 110. Together, interconnection paths 154, die studs 138, 140, and dielectric layer 110 form a first re-distribution layer 156. While FIGS. 14-16 set forth a process of attaching dies to a dielectric layer prior to forming interconnection paths, copper cladding may be pre-pattered to form interconnection paths before dies are affixed to dielectric layer in an alternative embodiment.

It is contemplated that additional re-distribution layers, such as second re-distribution layer 100 (FIG. 11), may be formed atop first re-distribution layer 156 using, for example, the process described with respect to FIGS. 9-12. Alternatively, any second and subsequent re-distribution layer (if used) may be constructed using a known method of fabricating a re-distribution layer, such as, for example, spin-coating or spray-coating a dielectric layer onto first re-distribution layer 156 or bonding a dielectric laminate layer, such as Kapton, to first re-distribution layer 156 using a conventional layer of adhesive.

After first re-distribution layer 156 (and any additional re-distribution layers, if used) is fabricated, an overall thickness or height of an IC package 158 may be reduced by removing a thickness 160 of bulk material from encapsulant 150 and dies 124, 126 via, for example, a grinding process. As shown, the grinding process removes any inconsistencies in the height of dies 124, 126, and IC package 158 may be formed having a planer bottom surface 162. IC package 158 may then be cut into individual CSPs or MCMs, which may, for example, be mounted onto conventional printed circuit boards or stacked to form POP structures.

Figure 18:
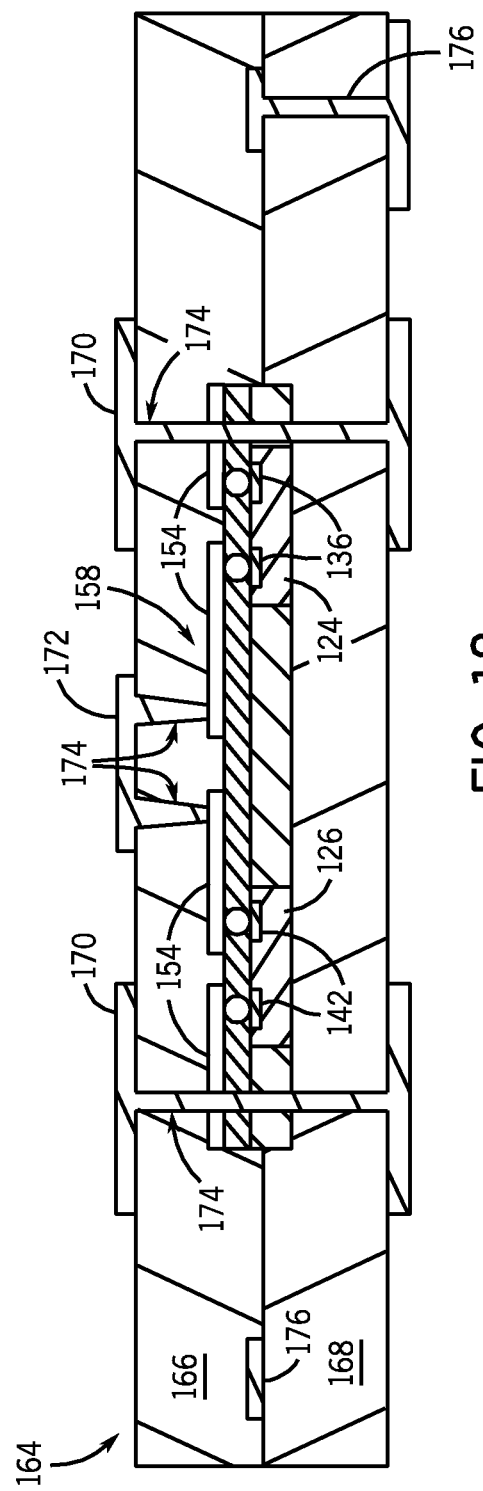
FIG. 18 is a schematic diagram showing an IC package incorporated in a multi-layer printed circuit in accordance with an embodiment of the invention.
Figure 19:
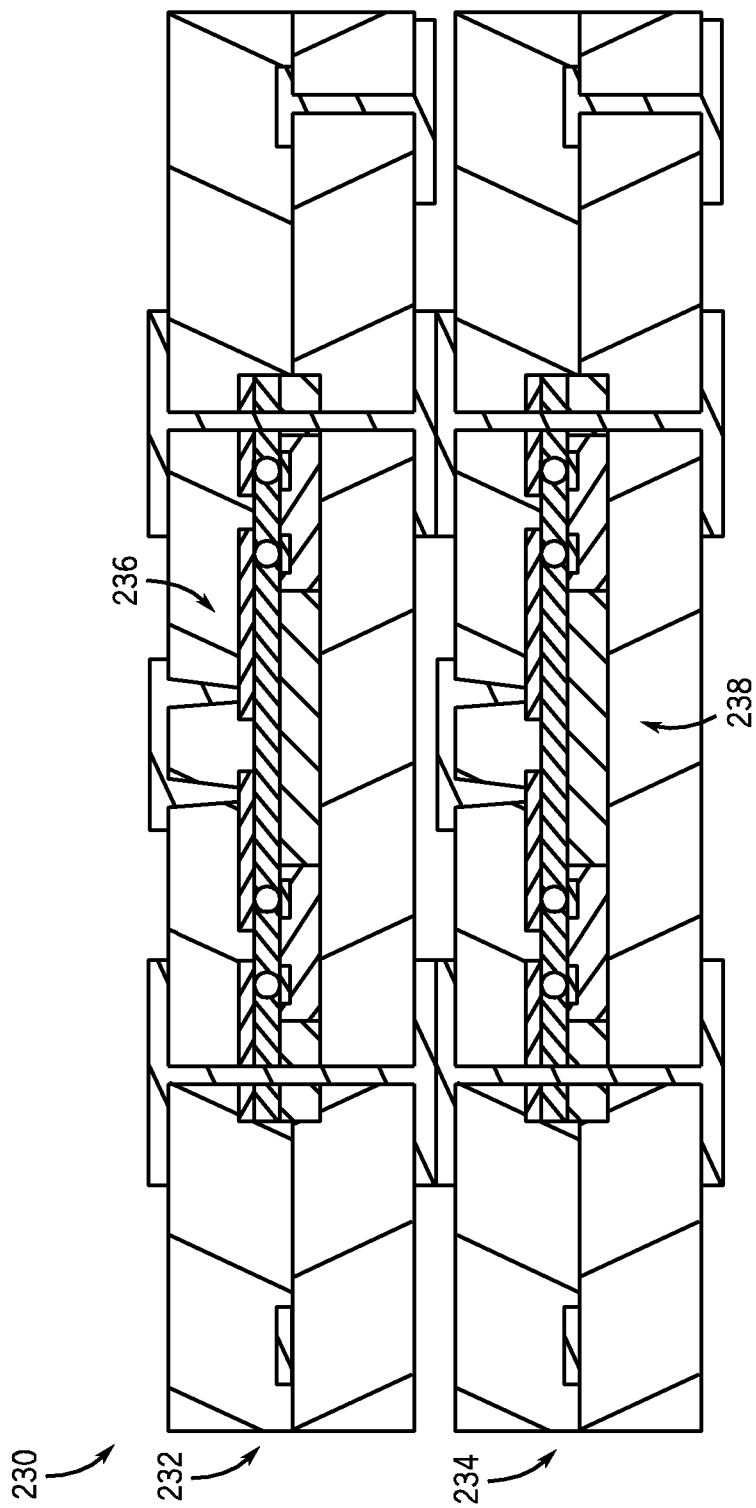
FIG. 19 is a schematic diagram showing a circuit assembly in accordance with an embodiment of the invention.

Alternatively, IC package 158 may be incorporated within a multi-layer printed circuit 164, formed of an FR-4 laminate or polyimide material, for example. As shown in FIG. 18, according to one embodiment, IC package 158 is sandwiched between layers 166, 168 of multi-layer printed circuit 164. Metallization paths 170, 172 may be created by metalizing vias 174 formed within layers 166, 168. Vias 174 may be, for example, through-hole vias, laser-drilled vias, or mechanically-formed blind vias. Metallization paths 170, 172 connect to a metal-cladding or metallization layer 154 of IC package 158 to form electrical connections between contact pads 136, 142 of dies 124, 126 and multi-layer printed circuit 164. Metallization paths 170, 172 may be coupled to inputs/outputs (not shown) and/or standard circuit connections 176 of multi-layer printed circuit 164 for external access to IC package 158. While only one IC package is shown incorporated within multi-layer printed circuit 164, it is contemplated that multiple IC packages may be formed within multi-layer printed circuit 164 in any stacked or tiled configuration. As shown in FIG. 19, a circuit assembly 230 may be formed by stacking two or more multi-layer printed circuits 232, 234 each having a respective IC package 236, 238 sandwiched therein.

Figure 20:
FIGS. 20-23 are schematic block diagrams showing steps of making a chip scale package in accordance with another embodiment of the invention.

Referring now to FIGS. 20-23, a technique for fabricating an IC package 178 is set forth according to another embodiment of the invention. As shown in FIG. 20, the technique begins with a copper clad film 180 having a first surface 182 and a second surface 184, a dielectric layer 186, a release liner 188, and a copper cladding 190.

Figure 21:
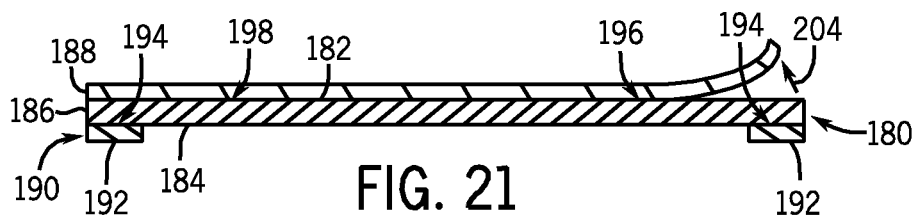
Figure 22:
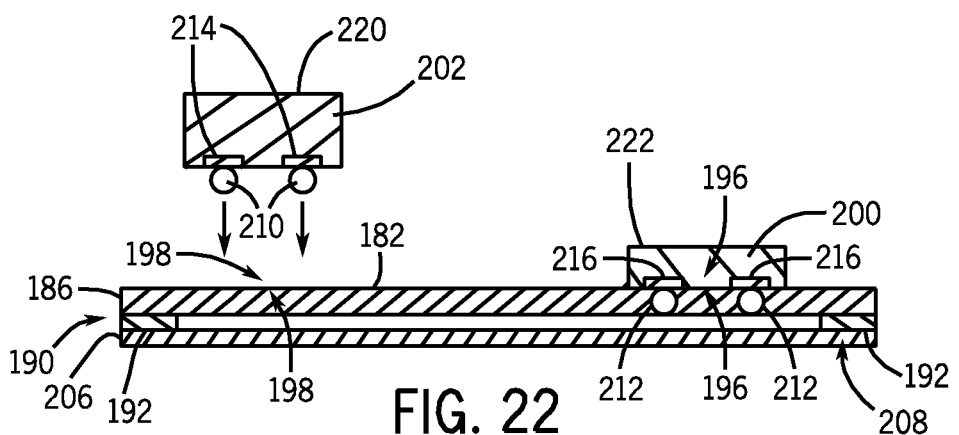

Referring now to FIG. 21, copper clad film 180 is patterned to form a plurality of alignment pads 192 positioned at pre-determined alignment locations 194 on second surface 184. As shown in FIGS. 21-22, alignment locations 194 correspond to pre-determined contact locations 196, 198, of dies 200, 202, respectively. As such, alignment pads 192 may assist in manual positioning dies 200, 202 on second surface 184 or function as markers for a pick-and-place machine. In a next step of the fabrication technique, release liner 188 is removed from copper clad film 180 (as shown by arrow 204).

As shown in FIG. 22, support plate or support layer 206 is affixed to an exterior surface 208 of copper cladding 190. Layer 206 lends structural support to copper clad film 180 when dies 200, 202 are affixed thereto. Support layer 206 also helps prevent second surface 184 of film 180 from adhering to a mounting frame such as frame 24 (FIG. 1) during placement of dies 200, 202. Dies 200, 202 are positioned at contact locations 198, 196 of first surface 182. Die studs 210, 212 are affixed to corresponding contact pads 214, 216 of dies 202, 200, respectively.

Referring again to FIGS. 21 and 22, while FIG. 22 shows dies 200, 202 attached to first surface 182 of film 180 and support layer 206 affixed to copper cladding 190, it is also contemplated that release liner 188 may instead act as a support layer. Specifically, after copper cladding 190 is patterned, release liner 188 may remain affixed to film 180 to act as a support layer. Once dies 200, 202 are positioned on second surface 184 of film 180, release liner 188 may be removed.

Alternatively, release liner 188 may also be removed after patterning of copper cladding 190. A support layer, such as support layer 206, may be then affixed to first surface 182 of dielectric layer 186 prior to positioning dies 200, 202 on second surface 184.

Figure 23:
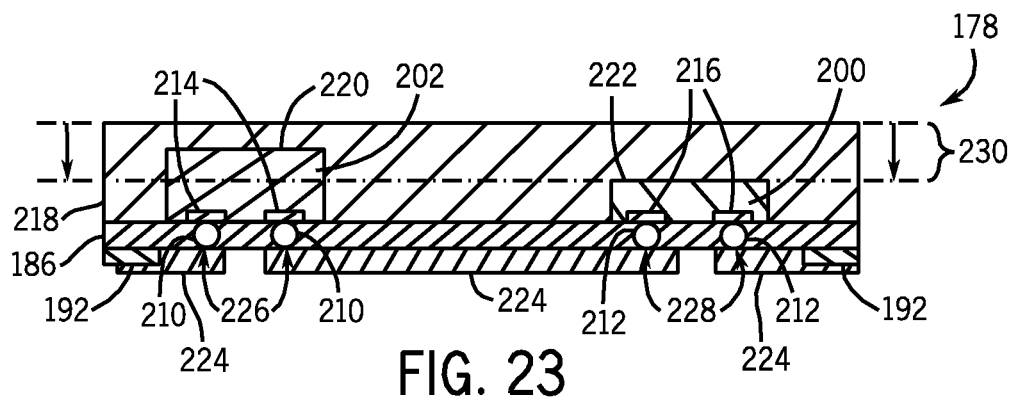

Referring now to FIG. 23, an encapsulant 218 may be applied to enmold a non-active surface 220, 222 of dies 200, 202, respectively. Encapsulant 218 and dielectric layer 186 are then allowed to cure. Once encapsulant 218 and dielectric layer 186 have cured, support plate 206 may be removed. In a next step of the technique, a series of metallization paths 224 may be patterned on second surface 184 of dielectric layer 186, using conventional processes. As shown in FIG. 22, metallization paths 224 contact interconnect locations 226, 228, which correspond the location of die studs 210, 212, respectively. Thus, metallization paths 224 form an electrical connection to contact pads 214, 216 of dies 200, 202, respectively. In addition, a thickness 230 of bulk material may be removed from IC package 178 to reduce the bulk size or overall height thereof.

Therefore, according to one embodiment of the invention, an apparatus includes a first dielectric layer comprising a dielectric film having a first side and a second side. The apparatus also includes a die having an active surface affixed to a contact location of the first side of the dielectric film absent a layer of adhesive therebetween that is distinct from a material of the dielectric film. A die stud is affixed to the active surface of the die and extends through the dielectric film to an interconnect location of the second side of the dielectric film, and a via is formed through the dielectric film by the die stud.

According to another embodiment of the invention, a method of fabricating an integrated circuit (IC) package includes providing a dielectric film and affixing an electrical component to a first surface of the dielectric film via an adhesive property of the dielectric film by pressing the electrical component into the dielectric film such that an attachment stud of the electrical component through the dielectric film. The method also includes curing the dielectric film after pressing the electrical component thereinto.

According to another embodiment of the invention, an apparatus includes a dielectric film having a first side and a second side. The apparatus also includes a plurality of components affixed to the first side of the dielectric film via an adhesive property of the dielectric film and absent a layer of adhesive between the plurality of components and the dielectric film that is distinct from a property of the dielectric film. The apparatus further includes at least one attachment stud affixed to a contact pad of each of the plurality of components. A via is formed through the dielectric film by the at least one attachment stud.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An apparatus comprising:
a first dielectric layer comprising a dielectric film having a first side and a second side;
a die having an active surface affixed to a contact location of the first side of the dielectric film such that the active surface of the die is in direct contact with the first side of the dielectric film;
a die stud affixed to the active surface of the die and extending through the dielectric film to an interconnect location of the second side of the dielectric film; and
an embedding compound encapsulating the die and coating a portion of the first side of the dielectric film outside the contact location; and
wherein a bottom-most surface of the die stud is affixed to the active surface of the die and a top-most surface of the die stud is substantially coplanar with the second side of the dielectric film.

2. The apparatus of claim 1 further comprising a die pad affixed to the active surface of the die, and wherein the die stud is affixed to the die pad.

3. The apparatus of claim 1 further comprising a metal cladding affixed to the second side of the dielectric film such that a first surface the metal cladding is in direct physical contact with the second side of the dielectric film.

4. The apparatus of claim 3 further comprising a second dielectric layer comprising a dielectric material affixed to the metal-cladding such that the second dielectric layer is in direct physical contact with a second surface of the metal cladding.

5. The apparatus of claim 3 wherein a portion of the metal-cladding extends into the interconnect location of the second side of the dielectric film.

6. The apparatus of claim 5 wherein the metal-cladding is electrically coupled to the die stud.

7. The apparatus of claim 3 wherein the metal-cladding comprises an alignment pad positioned at a pre-determined alignment location of the second side of the dielectric film.

8. The apparatus of claim 1 wherein the die stud comprises a metal stud bump.

9. The apparatus of claim 1 wherein the die stud comprises a proud sputter-plated metal pad; and
wherein the metal pad is in direct physical contact with the dielectric film.

10. The apparatus of claim 1 wherein the dielectric film comprises one of a thermoset material and a thermoplastic material.

11. A method of fabricating an integrated circuit (IC) package comprising:
providing an electrical component having an attachment stud affixed thereto; and
affixing the electrical component to a first surface of a dielectric film via an adhesive property of the dielectric film such that the attachment stud of the electrical component extends through the dielectric film.

12. The method of claim 11 further comprising:
pressing the electrical component into the dielectric film; and
removing an excess portion of the attachment stud.

13. The method of claim 11 further comprising selectively removing a portion of a metal-clad layer affixed to the second surface of the dielectric layer.

14. The method of claim 13 wherein removing a portion of the metal-clad layer comprises forming an electrical interconnect path coupled to the attachment stud.

15. The method of claim 13 wherein removing a portion of the metal-clad layer comprises forming an alignment pad at a pre-determined alignment location.

16. The method of claim 15 further comprising affixing a removable support layer to the metal-clad layer.

17. The method of claim 15 further comprising forming a metallization layer on the second surface of the dielectric layer.

18. The method of claim 11 further comprising encapsulating a non-active surface of the electrical component and a portion of the first surface of the dielectric layer in an embedding compound.

19. The method of claim 11 further comprising curing the dielectric film after pressing the electrical component thereinto.

20. The method of claim 11 further comprising removing a portion of bulk material from the electrical component to reduce an overall height of the IC package.

21. An apparatus comprising:
a dielectric film having substantially uniform material properties throughout a thickness of the dielectric film, wherein the thickness is defined between a first side and a second side of the dielectric film;
a plurality of components affixed to the first side of the dielectric film via an adhesive property of the dielectric film and absent a layer of adhesive between the plurality of components and the dielectric film that is distinct from a property of the dielectric film;
at least one attachment stud affixed to a top surface of a contact pad of each of the plurality of components;
a metal-clad layer having a bottom surface directly affixed to the second side of the dielectric film; and
wherein the entire volume of the at least one attachment stud is positioned between a lower plane defined by the top surface of the contact pad and an upper plane defined by the bottom surface of the metal-clad layer; and
wherein the dielectric film and the plurality of components are embedded within a multi-layer printed circuit.

22. The apparatus of claim 21 wherein the metal-clad layer is electrically coupled to the at least one attachment stud; and
wherein the at least one attachment stud comprises a metal stud bump.

23. The apparatus of claim 21 wherein the dielectric film comprises one of a thermoset material and a thermoplastic material.

24. The apparatus of claim 1 wherein the dielectric film is absent a layer of adhesive that is distinct from the material of the dielectric film.

25. The apparatus of claim 1 wherein a via is formed through the dielectric film by the die stud.

26. The method of claim 19 wherein curing further comprises curing the embedding compound.

27. The apparatus of claim 21 wherein a via is formed through the dielectric film by the at least one attachment stud.

28. A method of fabricating an integrated circuit (IC) package comprising:
affixing an attachment stud to a contact pad of a die;
removing a release liner from a first side of a dielectric film, the dielectric film having a metal cladding on a second side thereof; and
coupling the attachment stud with the dielectric film such that the attachment stud is in direct physical contact with the metal cladding and forms an electrical contact with the metal cladding.

29. The method of claim 28 wherein removing the release liner from the first side of the dielectric film comprises removing the release liner from the first side of one of a b-stage epoxy and a thermoplastic material; and wherein coupling the attachment stud with the dielectric film comprises pressing the attachment stud through the dielectric film from the first side.

30. The method of claim 28 wherein affixing the attachment stud comprises wirebonding a gold stud bump.

31. The method of claim 28 wherein affixing the attachment stud comprises sputter-plating a proud plated pad.

32. The method of claim 11 wherein affixing comprises affixing the electrical component to the first surface of the dielectric film such that an active surface of the electrical component is in direct contact with the first surface of the dielectric film.

* * * * *